(12) United States Patent
Dimitrelis

(10) Patent No.: US 7,079,407 B1
(45) Date of Patent: Jul. 18, 2006

(54) CONTENT ADDRESSABLE MEMORY (CAM) DEVICE INCLUDING MATCH LINE SENSING

(75) Inventor: Dimitrios Dimitrelis, Palo Alto, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 502 days.

(21) Appl. No.: 10/273,684

(22) Filed: Oct. 18, 2002

(51) Int. Cl.
*G11C 15/00* (2006.01)

(52) U.S. Cl. .................................. 365/49; 365/189.07

(58) Field of Classification Search ................... 365/49, 365/189.07
See application file for complete search history.

(56) References Cited

U.S. PATENT DOCUMENTS

| 6,181,591 B1 * | 1/2001 | Miyatake et al. ............. 365/49 |
| 6,195,277 B1 | 2/2001 | Sywyk et al. ................. 365/49 |
| 6,442,090 B1 | 8/2002 | Ahmed |
| 6,707,693 B1 * | 3/2004 | Ichiriu .......................... 365/49 |
| 6,760,241 B1 * | 7/2004 | Gharia ......................... 365/49 |
| 2002/0093347 A1 | 7/2002 | Henderson |

* cited by examiner

*Primary Examiner*—M. Tran
(74) *Attorney, Agent, or Firm*—Shemwell Mahamedi LLP

(57) ABSTRACT

A content addressable memory (CAM) device that includes a plurality of CAM cells coupled to a match line to affect a voltage of the match line in response to data values of the CAM cells and comparand data being in a predetermined logical relationship, and a match detect circuit coupled to the match line and adapted to differentially compare the voltage of the match line with a fixed reference voltage and, in response, generate an output signal having two or more logical states corresponding to the states of the predetermined logical relationship between the data value and the comparand data.

24 Claims, 3 Drawing Sheets

US 7,079,407 B1

CONTENT ADDRESSABLE MEMORY (CAM) DEVICE INCLUDING MATCH LINE SENSING

TECHNICAL FIELD

The disclosed embodiments relate generally to content addressable memory (CAM) devices.

BACKGROUND

A content addressable memory (CAM) device is a storage device that is particularly suitable for matching functions because it can be instructed to compare a specific pattern of comparand data with data stored in an associated memory array. A CAM, also referred to as an associative memory, can include a number of data storage locations, each of which can be accessed by a corresponding address. In a typical CAM matching function a comparand value (e.g., a header field or a portion thereof of a packet) is compared to the data values within the valid locations of the CAM. If the comparand value matches at least one data value of a valid location in the CAM, a match flag signal is generated and typically the address or index of the matching location is determined by a priority encoder. In the event there is more than one match, the address or index of one of the matching locations may be selected according to predetermined priority criteria. The match address or index can then be used to access other information (e.g., example routing or packet processing information in another memory).

Typically, a row of CAM cells in a CAM array is connected to a match line that indicates the match results for the row. The match results are typically detected by a logic gate such as an AND logic gate at a predetermined point in time when the match results are stable. The match result detected by the AND logic gate can then be latched by a latch circuit. The time required for the logic gate to detect the match result affects the overall operating speed of the CAM device before it can output a match flag signal and appropriate address or index of a matching location.

Figure 1:
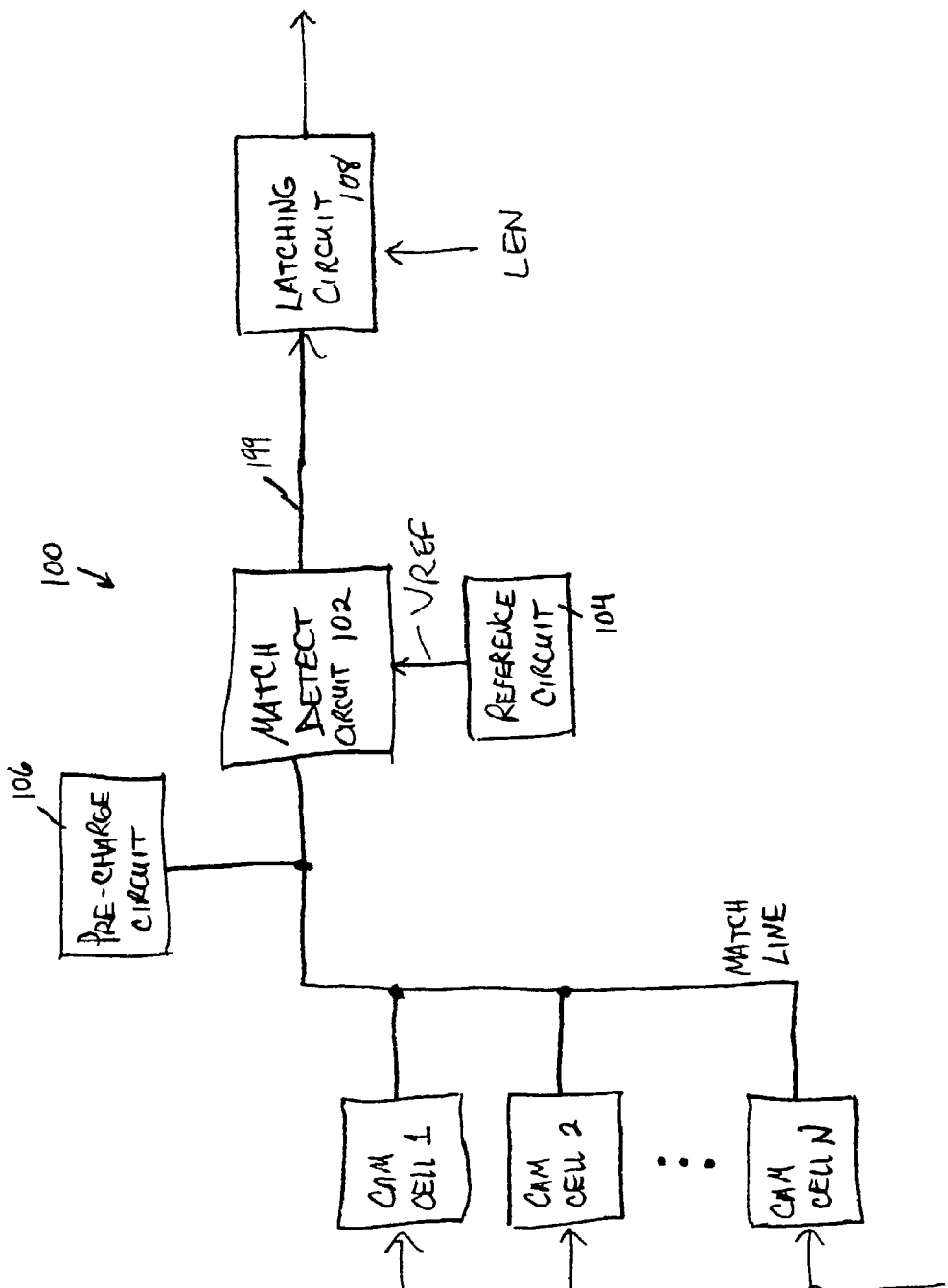
FIG. 1 is a block diagram of a row of CAM cells in a CAM device including a match detect circuit, under an embodiment.

In the drawings, the same reference numbers identify identical or substantially similar elements or acts. To easily identify the discussion of any particular element or act, the most significant digit or digits in a reference number refer to the Figure number to which that element is first introduced (e.g., element 104 is first introduced and discussed with respect to FIG. 1).

Unless described otherwise below, the construction and operation of the various blocks and structures shown in the Figures are of conventional design. As a result, such blocks need not be described in further detail herein, because they will be understood by those skilled in the relevant art. Such further detail is omitted for brevity and so as not to obscure the detailed description of the invention. Any modifications necessary to the Figures can be readily made by one skilled in the relevant art based on the detailed description provided herein.

DETAILED DESCRIPTION

A content addressable memory (CAM) device is disclosed that includes a match detect circuit coupled to a match line. The match detect circuit includes a sense or differential amplifier that detects changes in the voltage of a match line signal on the match line relative to a reference voltage that is fixed relative to the voltages of match line signal. In an embodiment, the match line signal is coupled to a first input of the sense or differential amplifier while the fixed reference voltage is coupled to a second input of the sense or differential amplifier, but the embodiment is not so limited.

The match detect circuit differentially compares the match line signal voltage with the reference voltage. In response to this comparison, the match detect circuit provides an output signal having one of two logic states. The first logic stage represents a condition in which the voltage of the match line signal is greater than the reference voltage. The second logic state represents a condition in which the voltage of the match line signal is less than the reference voltage. Consequently, the CAM device of the present invention provides accurate high-speed sensing of the match line state and, thus, the results of the compare circuit compare operations using a single-ended comparison of the match line voltage against a fixed reference voltage.

In the following description, for purposes of explanation, specific nomenclature is set forth and specific details are introduced to provide a thorough understanding of, and enabling description for, embodiments of the present invention. One skilled in the relevant art, however, will recognize that the present invention can be practiced without one or more of these specific details, or with other components, systems, etc. In other instances, well-known circuits, devices, structures or operations are not shown, or are not described in detail, to avoid obscuring aspects of the invention. Additionally, the interconnection between circuit elements or blocks may be shown as buses or as single signal lines. Each of the buses may alternatively be single signal lines, and each of the single signal lines may alternatively be buses. Additionally, the suffix "B" attached to signal names indicates that the signal is an active low signal. Each of the active low signals may be changed to active high signals as generally known in the art. Furthermore, the transistors of an embodiment are symmetrical devices so references to "source (drain)" and "drain (source)" are made to indicate the symmetrical nature of these couplings.

FIG. 1 is a block diagram of a row of CAM cells 100 for a CAM device, and includes CAM cells 1-N, pre-charge circuit 106, match detect circuit 102, reference circuit 104, and latching circuit 108. The CAM cells include at least one storage circuit and at least one compare circuit for comparing data stored in the storage circuit with input comparand data. For example, the CAM cells may be binary (i.e., effectively stores and compares on two logic states—logic 0 and logic 1) or ternary (i.e., effectively stores and compares on three logic states—logic 0, logic 1, and a don't care state) CAM cells formed as NAND or NOR based CAM cells. The storage circuit(s) in each CAM cell may be volatile (e.g., SRAM or DRAM based) or non-volatile (e.g., ROM, EEPROM, EPROM, Flash, etc.).

The CAM cells are coupled to a common match line that carries a match line signal indicative of whether the bits of the comparand match data values stored in corresponding CAM cells during a compare operation. The match line is pre-charged toward a first logic level by pre-charge circuit 106. Any embodiment of the pre-charge circuit may be used. The first logic level of an embodiment is approximately equal to a supply voltage $V_{DD}$, but the embodiment is not so limited and various alternative embodiments can pre-charge the match line to any potential value.

The architecture shown in FIG. 1 can be referred to as a "NOR-based" CAM structure because if any compare circuit within a particular CAM cell determines that its stored data value does not match a corresponding bit of the comparand, it pulls the match line to a second logic level. The second logic level of an embodiment is approximately equal to supply voltage $V_{SS}$, or ground potential, but the embodiment is not so limited. As with the first logic level, various alternative embodiments can pull the match line to any second potential value in response to a non-match condition. Only if all of the CAM cells store data that matches corresponding bits in the comparand (or the unmatching CAM cells are masked) will the match line remain in a pre-charged state. Other embodiments of CAM structures may also be used including a "NAND-based" CAM structure in which if all of the CAM cells of a particular row are serially coupled to each other between a power supply (e.g., VSS) and the match line output that is coupled to the pre-charge circuit and the match detect circuit.

With respect again to FIG. 1, match detect circuit 102 is coupled to the match line to receive the match signal that indicates a match or mismatch result of a compare operation within the row. Match detect circuit 102 is also coupled to receive a reference voltage VREF (or, alternatively, a reference current) from reference circuit 104. Reference circuit 104 may be any type of reference circuit that outputs one or more approximately fixed reference voltages. Match detect circuit 102 detects whether VREF is greater than (or greater than or equal to) or less than (or less than or equal to) the reference voltage, and provides an indication of this determination as output signal 199. For example, when the CAM cells store data that matches the comparand, the match line signal will have a voltage that is greater than (or greater than or equal to) VREF and output signal 199 assumes a first logic state (e.g., a high logic state), and when at least one of the CAM cells stores data that mismatches the comparand, the match line signal will have a voltage that is less than (or less than or equal to) VREF and output signal 199 assumes a second logic state (e.g., a low logic state). After output signal 199 is determined in response to a particular compare operation, latching circuit 108 latches the state of output signal in response to an enable signal LEN. Latching circuit may be any type of latching circuit including a flip-flop or timed/enabled logic gate.

The match detect circuit 102 of an embodiment includes a sense amplifier or differential amplifier configured to receive a single-ended match line. Using the single-ended input configuration, the match detect circuit 102 couples the match line to one input of the sense amplifier while coupling the remaining input of the sense amplifier to a reference voltage from the reference circuit 104. In this manner, the match detect circuit 102 provides single-ended comparisons of match line voltages against VREF that is fixed relative to the match line voltage. In alternative embodiments, reference circuit 104 may output more than one reference voltage (or reference current) to be compared with multiple voltage levels of the match signal on the match line.

Match detect circuit 102 can include, for example, High-Speed Transceiver Logic (HSTL) or Stub Series Terminated Logic (SSTL) technology, but alternative embodiments may use circuitry of other technologies appropriate for single-ended signal sensing in high-speed memory subsystems. Note that while match detect circuit 102, reference circuit 104, pre-charge circuit 106, and latching circuit 108 are illustrated in FIG. 1 as separate circuits, one or more of them may be combined.

By differentially comparing the match line voltage against the fixed reference voltage of the reference circuit 104, the match detect circuit 102 can detect a match or non-match condition on the match line more quickly than, for example, if detection was performed by a logic gate such as an AND gate or the like. This is illustrated graphically in FIG. 2.

Figure 2:
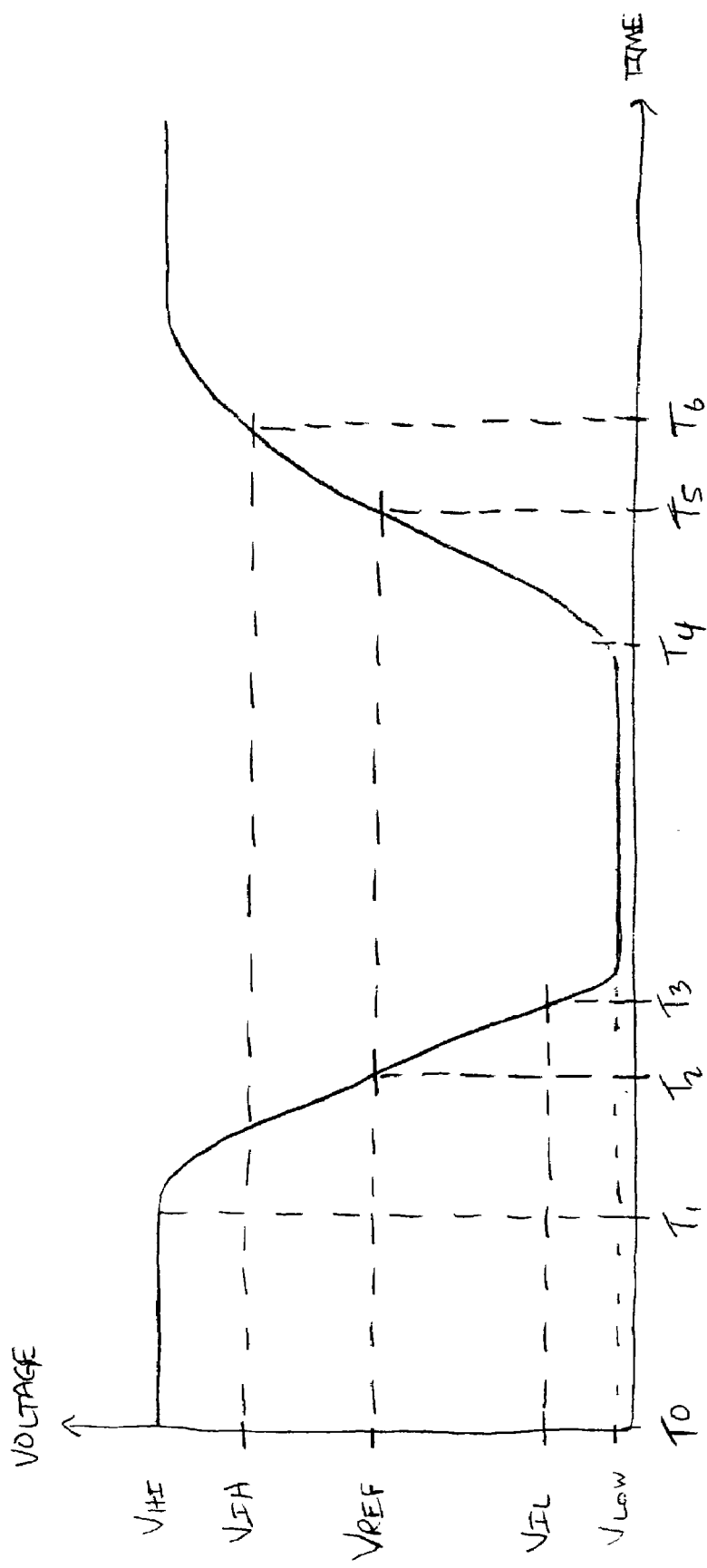
FIG. 2 is a qualitative graph of voltage versus time for a match line of a row of CAM cells.

FIG. 2 is a qualitative graph of match and mismatch voltages of the match signal on the match line over time. As shown, assume that the match line is at a voltage of VHI (e.g., approximately VDD) at time T0 indicative, for example, of a match condition. At this time, match detect circuit 102 detects that VHI is greater than VREF and drives output signal 199 to a first logic state (e.g., a logic one state). A compare operation is then performed and a mismatch condition exists in at least one of the (unmasked) CAM cells coupled to the match line. At time T1, the mismatching CAM cell(s) discharges the match line towards VLOW (e.g., approximately VSS). Match detect circuit 102 detects the mismatch condition at time T2 when the match line signal becomes less than VREF, and then changes the logic state of output signal 199 to a second logic state (e.g., a logic zero state). The logic zero state of output signal 199 can then be latched by latching circuit 108 anytime thereafter, and preferably soon thereafter to decrease the time taken to resolve the mismatch condition.

Another compare operation is then performed and a match condition exists for all CAM cells coupled to the match line. At time T4, the pre-charge circuit 106 pulls the match line towards VHI. Match detect circuit 102 detects the match condition at time T5 when the match line signal becomes greater than VREF, and then changes the logic state of output signal 199 back to the first logic state. The logic one state of output signal 199 can then be latched by latching circuit 108 anytime thereafter, and preferably soon thereafter to decrease the time taken to resolve the mismatch condition.

Note that if match detect circuit 102 were replaced with a logic gate such as an AND logic gate, the time to detect and latch the compare result would take longer than the embodiment of FIG. 1. For example, as shown in FIG. 2, the logic gate would not be able to detect the mismatch condition until time T3 when the voltage of the match line signal reached VIL of the logic gate, thus delaying detection and subsequent latching of the mismatch condition. Similarly, the logic gate would not be able to detect the match condition until time T6 when the voltage of the match line signal reached VIH of the logic gate, thus delaying detection and subsequent latching of the match condition.

Also note that in one embodiment, the pre-charge circuit 106 of FIG. 1 can pre-charge the match line to a voltage that is greater than VREF but less than VDD to further improve the detection speed of match detect circuit 102. For one embodiment, this pre-charge voltage can be less than VIH of a logic circuit such as an AND, OR or NOT logic circuit. Similarly, the CAM cells may discharge the match line to a voltage that is less than VREF but greater than VSS to further improve the detection speed of match detect circuit 102. For one embodiment, the stable discharge voltage can be greater than VIL of a logic circuit such as an AND, OR or NOT logic circuit.

Figure 3:
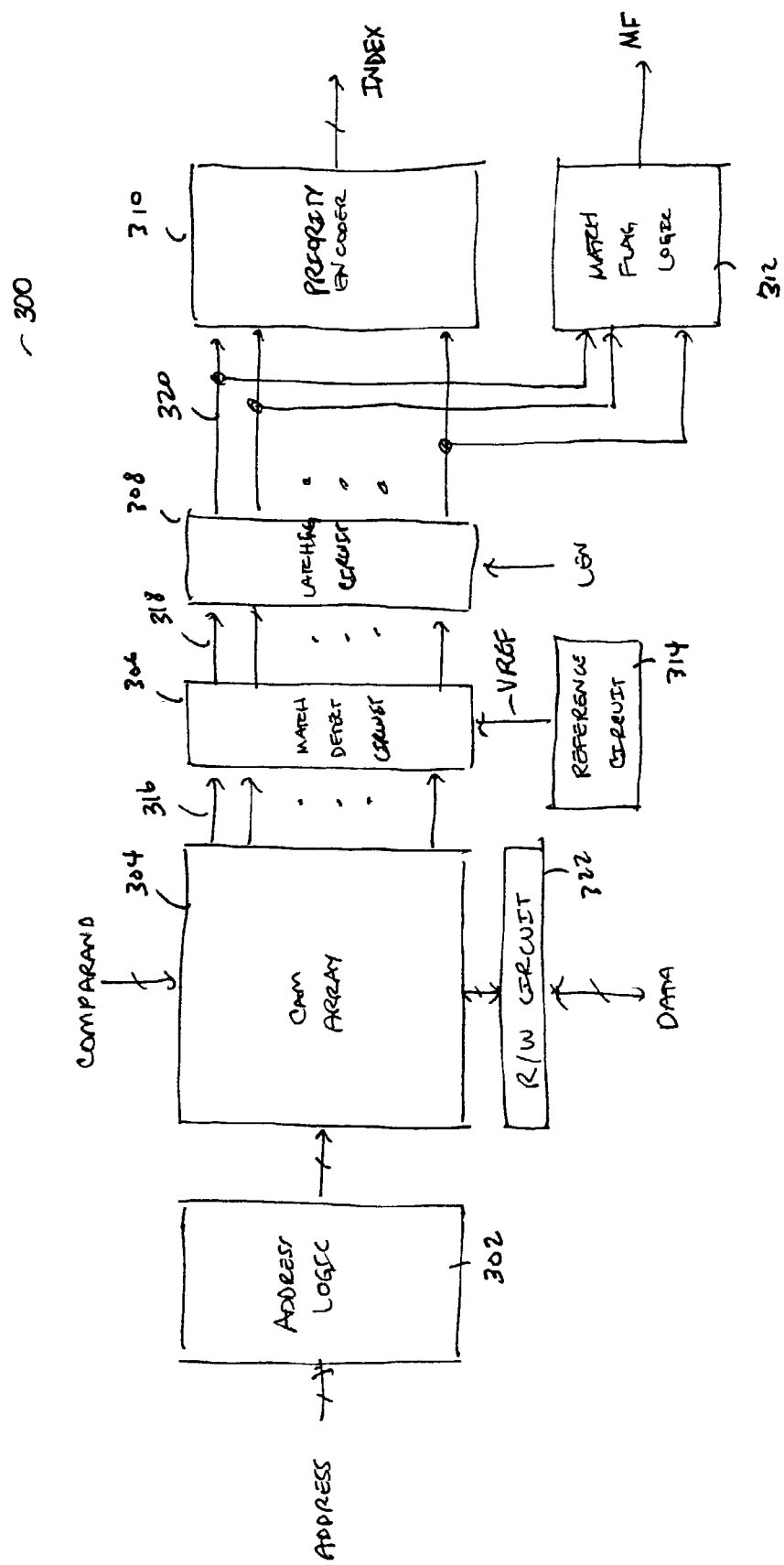
FIG. 3 is a block diagram of a CAM device including the row of CAM cells of FIG. 1.

FIG. 3 is a block diagram of one embodiment of a CAM device 300 that can incorporate the row of CAM cells 100 and FIG. 1 and pre-charge circuit 105, match detector 102, reference circuit 104, and latching circuit 108. The embodiment of FIG. 1 can also be used in other CAM devices of different configurations.

CAM device 300 includes address decoder 302, CAM array 304, read/write circuitry 322, match detect circuit 306, latching circuit 308, priority encoder 310, match flag logic 312, and reference circuit 314. CAM device 300 may include other circuits including error detection and/or correction circuitry, redundancy circuitry, control circuitry such as a state machine, instruction decoder or the like, global masks, and comparand filtering circuitry.

CAM array 304 is an array of CAM cells that includes any number of rows of CAM cells as shown in FIG. 1 each coupled to a corresponding match line 316. Data is written to CAM array 304 by read/write circuitry 322 and address logic 302. Address logic 302 selects one or more rows of CAM cells in response to an address. The write data is provided to the selected cells (e.g., over one or more data bit lines) by the write portion of read/write circuitry 322 (e.g., write buffers). Data is read from one or more selected rows of CAM cells by the read portion of read/write circuitry 322 (e.g., by one or more sense amplifier circuits).

When CAM array 304 is searched for a match of the stored data with the comparand, each matching location indicates a match or mismatch states as match signals on match lines 316. The match lines 316 are coupled to match detect circuit 306 that includes, for example, a match detect circuit 102 of FIG. 1 for each corresponding match line. Match detect circuit 306 is also coupled to receive a reference voltage VREF from reference circuit 314 such as reference circuit 104 of FIG. 1. Match detect circuit 306 outputs output signals on signal lines 318. Each output signal is corresponds to a match line 316 and carries an output signal (such as output signal 199 of FIG. 1) that indicates the whether the match signal on the corresponding match line is greater than (or greater than or equal to) or less than (or less than or equal to) VREF. The output signals on output signal lines 318 are then latched by latching circuit 308 in response to enable signal LEN. Latching circuit 308 includes, for example, a latching circuit 108 of FIG. 1 for each output signal line 318. The match results latched by latching circuit 308 are then output on signal line 320 to priority encoder 310 and match flag logic 312.

Match flag logic 312 indicates the existence of a match if at least one of the match results on signal line 320 carries a match signal indicating a match. Additional flag logic such as almost full flag logic, full flag logic, and/or multiple match flag logic may also be included in CAM device 300.

Priority encoder logic 310 translates a matched location(s) into an index (or a match address) and outputs this index. The index may be used, for example, to access another memory-based device. Priority encoder logic 310 also identifies which matching location has the top priority if there is more than one matching entry. For alternative embodiments, the priority encoder is an encoder that that does also perform a priority determination function.

The underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc. Furthermore, aspects of the invention may be implemented as functionality programmed into any of a variety of circuitry, including programmable logic devices (PLDs), such as field programmable gate arrays (FPGAs), programmable array logic (PAL) devices, electrically programmable logic, as well as application specific integrated circuits (ASICs).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," and words of similar import, when used in this application, shall refer to this application as a whole and not to any particular portions of this application.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other memory devices and systems, not only for the CAM cells described above.

The elements and acts of the various embodiments described above can be combined to provide further embodiments. These and other changes can be made to the invention in light of the above detailed description.

In general, in the following claims, the terms used should not be construed to limit the invention to the specific embodiments disclosed in the specification and the claims, but should be construed to include all memory-based systems that operate under the claims. Accordingly, the invention is not limited by the disclosure, but instead the scope of the invention is to be determined entirely by the claims.

While certain aspects of the invention are presented below in certain claim forms, the inventor contemplates the various aspects of the invention in any number of claim forms. Accordingly, the inventors reserve the right to add additional claims after filing the application to pursue such additional claim forms for other aspects of the invention.

What is claimed is:

1. A content addressable memory (CAM) device comprising:
   a plurality of CAM cells coupled to a match line to affect a voltage of the match line in response to a comparison between data values of the CAM cells and comparand data; and
   a match detect circuit coupled to the match line and coupled to receive a plurality of fixed reference voltages, the match detect circuitry including circuitry to compare the voltage of the match line with at least one of the plurality of fixed reference voltages and, in response, generate an output signal having two or more logical states according to whether the voltage of the match line exceeds the at least one of the plurality of fixed reference voltages.

2. The CAM device of claim 1, wherein the two logical states include a first logical state indicating that one or more of the data values does not match the comparand data of the match line and a second logical state indicating that the data values do match the comparand data of the match line.

3. The CAM device of claim 1, further comprising a pre-charge circuit coupled to pre-charge the voltage of the match line.

4. The CAM device of claim 1, wherein the match detect circuit includes a differential amplifier coupled to receive the match line signal at a first input and one of the plurality of fixed reference voltages at a second input.

5. The CAM device of claim 1, further comprising a reference circuit coupled to output the plurality of fixed reference voltages to the match detect circuit.

6. The CAM device of claim 1, further comprising circuitry to compare the voltage of the match line with each of the plurality of fixed reference voltages.

7. A content addressable memory (CAM) device comprising:
   a plurality of CAM cells coupled to a match line to affect a voltage of the match line in response to a comparison between data values of the CAM cells and comparand data; and
   means for receiving a plurality of fixed reference voltages, including means for comparing the voltage of the match line with at least one of the plurality of fixed reference voltages and, in response, generate an output signal having two or more logical states according to whether the voltage of the match line exceeds the at least one of the plurality of fixed reference voltages.

8. The CAM device of claim 7, further comprising means for generating the plurality of fixed reference voltages.

9. A content addressable memory (CAM) device comprising:
   a sense amplifier circuit coupled to a match line having inputs to receive a match line signal and a plurality of reference voltages, and an output to provide an output signal having a first logical state representative of a first condition in which a voltage of the match line signal is greater than one of the plurality of reference voltages and a second logical state representative of a second condition in which a voltage of the match line signal is less than one of the plurality of reference voltages.

10. The CAM device of claim 9, further comprising a plurality of CAM cells coupled to the match line, and wherein the first condition represents a match between data of the CAM cells and comparand data, wherein the second condition represents a non-match between data and comparand data resulting from the compare operations.

11. The CAM device of claim 9, wherein the sense amplifier includes a differential amplifier coupled to receive the match line signal at the first input and coupled to receive the one of the plurality of reference voltages at the second input.

12. The CAM device of claim 9, further comprising a latching circuit coupled to the output of the sense amplifier circuit.

13. The CAM device of claim 9, further comprising a pre-charge circuit coupled to the match line and the first input of the sense amplifier circuit.

14. The CAM device of claim 9, wherein the sense amplifier circuit is configured to compare the voltage of the match line with each of the plurality of fixed reference voltages.

15. A method, comprising:
    comparing comparand data with data values stored in a plurality of content addressable memory (CAM) cells to affect a voltage of a match line;
    generating a plurality of fixed reference voltages; and
    differentially sensing when the voltage of the match line is different than the one of the fixed reference voltages.

16. The method of claim 15, further comprising pre-charging the match line.

17. The method of claim 15, further comprising latching an output signal generated in response to the sensing.

18. The method of claim 15, wherein differentially sensing when the voltage of the match line is different than the one of the fixed reference voltages comprises comparing the voltage of the match line with each of the plurality of fixed reference voltages.

19. A method, comprising:
    receiving a match line signal from a match line coupled to a plurality of content addressable memory (CAM) cells;
    receiving a plurality of reference voltages that have respective fixed voltage values; and,
    generating an output signal having a first logical state representative of a first condition in which a voltage of the match line signal is greater than a first one of the plurality of reference voltages and a second logical state representative of a second condition in which a voltage of the match line signal is less than the first one of plurality of reference voltages.

20. The method of claim 19, further comprising comparing comparand data with data of the CAM cells.

21. The method of claim 19, wherein the generating comprises differentially sensing when the voltage of the match line signal is greater than the first one of the plurality of reference voltages and when the voltage of the match line signal is less than the first one of the plurality of reference voltages.

22. The method of claim 19, further comprising latching the output signal.

23. The method of claim 19, further comprising pre-charging the match line.

24. The method of claim 19, wherein generating the output signal comprises comparing the voltage of the match line with each of the plurality of fixed reference voltages.

* * * * *